United States Patent
Le Guillou et al.

(10) Patent No.: US 8,159,380 B2
(45) Date of Patent: Apr. 17, 2012

(54) CONTINUOUS-TIME SIGMA-DELTA ANALOG-TO-DIGITAL CONVERTER WITH NON-INVASIVE FILTER(S) FOR IMMUNITY PRESERVATION AGAINST INTERFERERS

(75) Inventors: Yann P. Le Guillou, Caen (FR); Hussein Fakhoury, Namur (BE)

(73) Assignee: ST-Ericsson SA, Geneva (CH)

( * ) Notice: Subject to any disclaimer, the term of this patent is extended or adjusted under 35 U.S.C. 154(b) by 702 days.

(21) Appl. No.: 11/719,539

(22) PCT Filed: Nov. 10, 2005
(Under 37 CFR 1.47)

(86) PCT No.: PCT/IB2005/053709
§ 371 (c)(1),
(2), (4) Date: Jul. 28, 2009

(87) PCT Pub. No.: WO2006/054214
PCT Pub. Date: May 26, 2006

(65) Prior Publication Data
US 2011/0156940 A1    Jun. 30, 2011

(30) Foreign Application Priority Data
Nov. 16, 2004 (EP) .................................. 04300795

(51) Int. Cl.
*H03M 3/00* (2006.01)
(52) U.S. Cl. ........................................ 341/143; 341/155
(58) Field of Classification Search ................... 341/143
See application file for complete search history.

(56) References Cited

U.S. PATENT DOCUMENTS

| | | | |
|---|---|---|---|
| 5,027,120 A | 6/1991 | Thurston | |
| 5,668,552 A * | 9/1997 | Thurston | 341/143 |
| 5,982,316 A | 11/1999 | Shin | |
| 6,243,430 B1 | 6/2001 | Mathe | |

(Continued)

FOREIGN PATENT DOCUMENTS

GB    2256331 A    12/1992

(Continued)

OTHER PUBLICATIONS

Japanese Office Action with English translation of Decision of Rejection for JPN Application No. 2007-540807, mailed May 27, 2011, pp. 5.

(Continued)

*Primary Examiner* — Khai M Nguyen
(74) *Attorney, Agent, or Firm* — Hogan Lovells US LLP (57) ABSTRACT

A continuous-time sigma-delta analog-to-digital converter (CV) comprises i) a signal path (SP) which includes at least one combiner (C1) for combining analog signals to be converted with analog feedback signals, at least one integrator (H1) for integrating the combined analog signals, a quantizer (Q) for converting the integrated signals into digital signals, and ii) a feedback path (FP) comprising at least a digital-to-analog converter (DAC) for converting the digital signals outputted by the quantizer (Q) into analog feedback signals intended for the combiner (C1). It also comprises at least one non-invasive filter (N1) associated to the integrator (H1), connected in parallel to the signal path (SP) at a chosen location and arranged to introduce a notch into its signal transfer function by suppressing unwanted analog interference signals having a chosen frequency band that corresponds to this notch.

21 Claims, 3 Drawing Sheets

U.S. PATENT DOCUMENTS

| | | |
|---|---|---|
| 6,407,689 B1 | 6/2002 | Bazarjani et al. |
| 6,700,519 B2 | 3/2004 | Yamamoto |
| 7,034,728 B2 * | 4/2006 | Luh et al. ............ 341/143 |

FOREIGN PATENT DOCUMENTS

| | | |
|---|---|---|
| JP | 2000216680 A | 8/2000 |
| JP | 2004080430 A | 3/2004 |
| WO | 01/03312 A1 | 1/2001 |

OTHER PUBLICATIONS

Japanese Application No. JP20000150966 20000523, with English Abstract, Nov. 30, 2001, pp. 6.

Japanese Application No. JP20010199803 20010629, with English Abstract, Jan. 11, 2011, pp. 14.

Japanese Application No. JP19930284845 19931115, with English Abstract, Jun. 2, 1995, pp. 9.

Japanese Application No. JP20010227125 20010727, with English Abstract, Apr. 19, 2002, pp. 13.

"A 2MW 89DB DR Continuous-Time ADC With Increased Immunity to Wide-Band Interferers", K. Philips, ISSCC Dig Tech Papers, Feb. 2004.

"Elliptic Filtering in Continuous-Time SIGMA-Delta Modulator" Le Guillou Y et al, Feb. 17, 2005.

"A Low-Power 2.4-GHZ Transmitter/Receiver CMOS IC", Zolfaghari A et al, Feb. 2003.

* cited by examiner

FIG. 6

CONTINUOUS-TIME SIGMA-DELTA ANALOG-TO-DIGITAL CONVERTER WITH NON-INVASIVE FILTER(S) FOR IMMUNITY PRESERVATION AGAINST INTERFERERS

FIELD OF THE INVENTION

The present invention relates to the domain of radio signal processing, and more precisely to the analog-to-digital signal conversion and filtering of radio signals.

BACKGROUND OF THE INVENTION

Much radio communication equipment, such as mobile phones, comprises a receiver (or a transceiver) arranged to receive analog radio signals, then select those belonging to a chosen bandwidth, then convert the selected analog signals into digital signals before demodulating them.

When the receiver (or transceiver) is designed to work in a multi-standard environment, it may also convert and process unwanted interferers which may desensitize it and hence decrease the receiving quality.

Several solutions have been proposed to suppress the unwanted interferers.

A first conventional solution consists in using an analog pre-filter before the analog-to-digital converter (ADC), and a digital filter after the ADC. The analog pre-filter, which defines the baseband part of the receiver, comprises a cascade of filters and programmable gain amplifiers (PGAs). The cascade of filters reduces interference to a chosen level to avoid an ADC overload, whereas the PGAs limit the signal under a pre-defined chosen level to reduce the dynamic range of the ADC.

Every analog component adds noise and distortion, which reduces the sensitivity of the receiver. Moreover, the offset and gain or phase error are accumulating factors and a lot of calibration and control loops are needed for correction, which increases the design time, the complexity and the risks.

A second solution consists in using a full-digital architecture, without any analog filter or PGA. The whole signal processing (filtering and scaling of word lengths) takes place in the digital domain, which offers a high flexibility. For instance one uses a sigma-delta (ΣΔ) ADC (which offers a low power consumption and anti-aliasing filter features) followed by a channel filtering, an interference filtering and a noise-shaping digital filtering.

As the interference filtering takes place after the analog-to-digital conversion, the analog signals inputted in the ADC comprise the wanted signals as well as the unwanted ones. Therefore, the bandwidth and the dynamic range of the ADC need to be very high. Moreover, the ADC needs to be extremely linear to prevent the risk of intermodulation distortion of large interferers which would disturb the reception of wanted signals belonging to a weak channel, as is the case in the UMTS standard with the UTRA/FDD band II interferers. Due to these drawbacks, the full-digital architecture requires a lot of power.

A third solution consists in using a sigma-delta (ΣΔ) ADC including an interference filter function.

Such a solution is described in the document by K. Philips et al: "A 2 mW 89 dB DR Continuous-Time ΣΔ ADC with Increased Immunity to Wide-Band Interferers", ISSCC Dig. Tech. Papers, pp 86-87, February 2004. The filtering is realized in the ADC by adding a high-pass feedback path to a conventional ΣΔ ADC and a compensating low-pass filter in the forward path to maintain stability. The presented solution shows an input-referred dynamic range of 89 dB in 1 MHz bandwidth and a power consumption lower than 2 mW. An n-th order continuous-time feedback or feedforward topology inherently provide an anti-aliasing filtering.

An n-th order continuous-time feedback topology has an n-th order low-pass filter signal transfer function (STF) at high frequencies, whereas an n-th order continuous-time feedforward topology has a first-order low-pass filtering STF at high frequencies. Therefore the n-th order continuous-time feedback topology provides more filtering than the n-th order continuous-time feedforward topology and is more prone to be used for filtering. Unfortunately, the latter filtering becomes efficient when the interferers are at least one decade above the upper edge of the bandwidth concerned. So it is not really suited to highly digitized multi-standard and/or multi-mode receivers (or transceivers) and more precisely to the co-banding of TDMA, CDMA and W-CDMA.

The third solution is also described in the patent document WO 01/03312. Here one uses a distributed weighted feedforward topology and a distributed weighted feedback topology to feed a series of integrators respectively with the analog signals to be converted and with the digital signals outputted by a quantizer. With such a dual topology one is supposed to be capable of introducing at least one "notch" in the signal transfer function (STF) of the ADC thus allowing suppression of the unwanted interferers belonging to the frequency band corresponding to the notch.

However, the number of notches which can be introduced depends on the order (L) of the filter (i.e. the number of integrators). The number of notches is effectively limited to L/2 when the order (L) of the filter is even, and to (L−1)/2 when the order of the filter is odd. Therefore, to introduce a notch the filter order must be greater than or equal to 2, which excludes the first-order filters often used in the so-called MASH structures, such as MASH-2-1, MASH-1-2, MASH-1-1 and MASH-1-1-1.

Moreover, the implementation of notch(es) neutralizes two poles of the STF, which reduces the far filtering from 20*L dB/decade to 20*[L−(2*n)] dB/decade where n is the number of notches.

What is more, the noise transfer function (NTF) is bound to the distributed weighted feedforward topology used.

Still more, this solution is simulated with a linearized quantizer gain equal to 1. But this is not realistic because when the gain is equal to 1 the signal amplitude at an integrator output can saturate the next integrator which can strongly damage the signal-to-noise ratio (SNR) of the ADC. Moreover, in practice the quantizer is strongly not linear, so that it is important to keep a sufficiently high gain to guarantee the "high signal" stability in the ADC loop.

SUMMARY OF THE INVENTION

So, the object of this invention is to improve the situation at least partly, especially in case of co-banding.

For this purpose, the invention provides a continuous-time sigma-delta analog-to-digital converter (ΣΔ ADC), for converting analog signals belonging to a chosen bandwidth into digital signals according to a signal transfer function (STF), comprising:
  a main path including at least one combiner for combining analog signals to be converted with analog feedback signals, at least one integrator for integrating the combined analog signals, a quantizer for converting the integrated signals into digital signals, and a feedback path comprising at least a digital-to-analog converter (DAC) for converting the digital signals outputted by the quantizer into analog feedback signals intended for the combiner.

This converter (ΣΔ ADC) is characterized in that it also comprises at least one non-invasive filter associated to the integrator, connected in parallel to the signal path at a chosen location and arranged to introduce a notch into the STF by suppressing unwanted analog interference signals having a chosen frequency band that corresponds to this notch.

The converter (ΣΔ ADC) according to the invention may include additional characteristics considered separately or combined, and notably:

its signal path may comprise at least two different integrators connected in series, and for instance five;

its feedback path may comprise at least one digital weighting means for converting the analog feedback signals into weighted analog feedback signals intended for the combiner;

its signal path may comprise at least two (for instance five) combiners respectively associated to the two integrators, and its feedback path may comprise at least two (for instance five) different analog weighting means adapted to convert the analog feedback signals into differently weighted analog feedback signals respectively intended for the two (for instance five) combiners;

at least one local resonator feedback means may be connected in parallel with the signal path and arranged to weight the analog signals outputted by one chosen integrator with a chosen coefficient to feed a combiner, located in the signal path before another integrator located before this chosen integrator, with weighted analog signals;

at least one weighted feedforward summation path may be connected in parallel with the signal path and arranged to weight the analog signals outputted by at least one chosen integrator with a chosen coefficient to feed a combiner, located after this chosen integrator, with weighted analog signals;

its signal path may comprise another combiner located between the last integrator and the quantizer, and it may comprise a weighted feedforward summation path connected in parallel with the signal path and arranged to weight the analog signals, outputted by each of the integrators, except for the last one, with different chosen coefficients to feed this other combiner with weighted analog signals;

its signal path may comprise at least two combiners located in the signal path before two chosen different integrators, and it may comprise at least two local resonator feedback means connected in parallel with the signal path and arranged to weight the analog signals outputted by two other chosen integrators with chosen coefficients to feed these combiners with weighted analog signals;

its signal path may comprise first and second integrators connected in series, and first and second combiners respectively connected in series before the first integrator and after the second integrator, and it may comprise:

a weighted feedforward summation path connected in parallel with the signal path and arranged to weight the analog signals outputted by the first integrator with a chosen coefficient to feed the second combiner with weighted analog signals, at least a third combiner fed with the analog signals outputted by the second combiner and by the DAC, at least one auxiliary ΣΔ ADC, comprising an auxiliary signal path comprising at least a fourth combiner, adapted to combine analog signals outputted by the third combiner with auxiliary weighted analog feedback signals, at least one auxiliary integrator adapted to integrate the combined analog signals, an auxiliary quantizer, adapted to convert the integrated signals into digital signals, at least one auxiliary non-invasive filter connected in parallel to the auxiliary signal path and arranged to introduce a notch into the STF of the auxiliary ΣΔ ADC by suppressing unwanted analog interference signals having a chosen frequency band that corresponds to this notch, and an auxiliary feedback path comprising an auxiliary digital-to-analog converter adapted to convert the digital signals outputted by the auxiliary quantizer into auxiliary analog feedback signals, and at least one auxiliary analog weighting means adapted to convert the auxiliary analog feedback signals into auxiliary weighted analog feedback signals intended for the fourth combiner, and an error cancelling logic means fed with digital signals outputted by the quantizer and the auxiliary quantizer respectively, to determine a quantization error in the outputted digital signals and retrieve it from them;

its signal path may comprise at least two non-invasive filters associated to two different integrators respectively, connected in parallel to the signal path at two chosen locations and arranged to suppress unwanted analog interference signals having two different chosen frequency bands;

each non-invasive filter may be connected to the (auxiliary) signal path before the integrator it is associated to;

in a variant each non-invasive filter may be connected to the (auxiliary) signal path after the integrator it is associated to;

each non-invasive filter and/or auxiliary non-invasive filter may be a resonator;

for instance each resonator comprises first and second transconductances and a first capacitor connected in series, a second capacitor connected in parallel with the first transconductance, and a third transconductance connected in parallel with the second transconductance;

the (auxiliary) DAC and the quantizer may be single-bit or multi-bit components;

the (auxiliary) non-invasive filters may be programmable.

The invention also provides an integrated circuit (IC), and possibly a baseband integrated circuit, comprising a converter such as the one introduced above. Such a (baseband) integrated circuit may be part of a receiver or transceiver device.

The invention also provides mobile radio communication equipment comprising a converter or a (baseband) integrated circuit or a receiver or transceiver device such as the ones introduced above.

BRIEF DESCRIPTION OF THE DRAWINGS

Other features and advantages of the invention will become apparent on examining the detailed specifications hereafter and the appended drawings, wherein.

The appended drawings may not only serve to complete the invention, but also to contribute to its definition, if need be.

DESCRIPTION OF PREFERRED EMBODIMENTS

Figure 1:
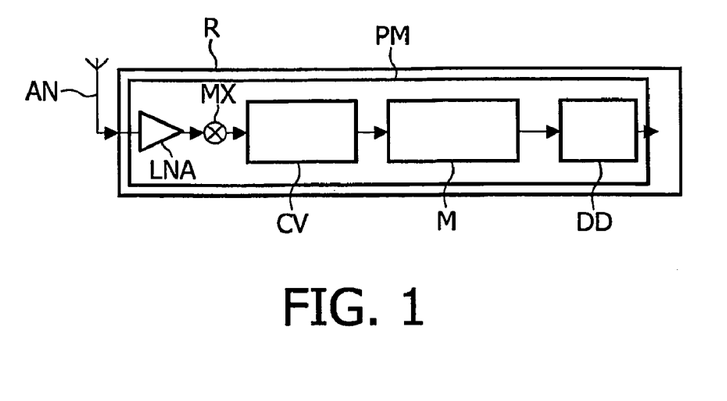
FIG. 1 schematically illustrates an example of a receiver device according to the invention, FIG. 2 schematically illustrates a first example of embodiment of a continuous-time sigma-delta analog-to-digital converter (ΣΔ ADC) according to the invention, FIG. 3 schematically illustrates a second example of embodiment of a continuous-time sigma-delta analog-to-digital converter (ΣΔ ADC) according to the invention, FIG. 4 schematically illustrates a third example of embodiment of a continuous-time sigma-delta analog-to-digital converter (ΣΔ ADC) according to the invention, FIG. 5 schematically illustrates a fourth example of embodiment of a continuous-time sigma-delta analog-to-digital converter (ΣΔ ADC) according to the invention, FIG. 6 schematically illustrates a fifth example of embodiment of a continuous-time sigma-delta analog-to-digital converter (ΣΔ ADC) according to the invention.

Reference is initially made to FIG. 1 to describe an example of a receiver device R in which the invention may be applied. It is important to note that the invention is not limited to receiver devices. Indeed it applies also to transceiver devices, and more generally to any type of device adapted to receive analog radio signals to be converted into digital signals.

In the following description it will be considered that the receiver (or transceiver) device R is intended for mobile communication equipment such as a mobile phone, for instance a GSM or GPRS/EDGE or UMTS mobile phone, or Bluetooth or WLAN (Wireless Local Area Network) communication equipment. But it is important to note that the invention is not limited to this type of radio communication equipment. Indeed, the invention providing a sharp filtering close to the bandwidth of the signal to be converted may also be used for car radio, or for medical purposes where a high signal purity and hence filtering associated with high dynamic range analog/digital (A/D) converter is a constant challenge, or else for measurement equipment (for instance scope).

As schematically illustrated in FIG. 1, a receiver (device) R according to the invention notably comprises an antenna AN adapted to receive analog modulated signals and a processing module PM fed with the received analog signals.

The processing module PM comprises a low noise amplifier LNA arranged to amplify the analog signals received by the antenna AN to feed a mixer MX, which feeds a continuous-time sigma-delta analog-to-digital converter (hereafter named "ΣΔ converter") CV according to the invention, arranged to convert and filter the amplified analog signals into digital signals to be fed to a module M dedicated to channel filtering and noise-shaping digital filtering and which feeds a digital demodulator DD arranged to demodulate the filtered digital signals.

Figure 2:
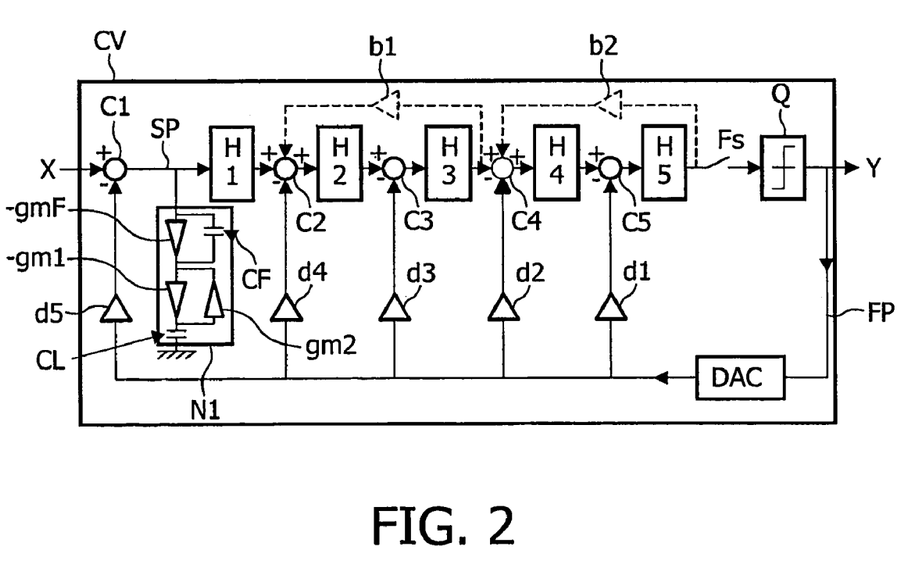

Reference is now made to FIG. 2 to describe a first example of ΣΔ converter CV according to the invention.

As illustrated the ΣΔ converter CV comprises at least a signal path SP comprising at least one combiner C1 for combining the amplified analog signals X to be converted with analog feedback signals, at least one integrator H1 for integrating the combined analog signals outputted by the combiner C1, and a quantizer Q for converting the integrated signals outputted by the integrator H1 into digital signals Y in this example.

It also comprises at least one non-invasive filter N1 associated to the integrator H1, connected in parallel to its signal path SP at a chosen location and arranged to introduce a notch into its signal transfer function (or STF) in order to suppress unwanted analog interference signals whose frequencies (or wavelengths) are by definition outside the desired signal bandwidth. Since the notch created by N1 is outside the desired bandwidth, i.e. in the stop band, it enables to design elliptic STF.

It further comprises a feedback path FP comprising at least a digital-to-analog converter DAC arranged to convert the digital signals outputted by the quantizer Q into analog feedback signals intended for the combiner C1 (at least).

Figure 5:
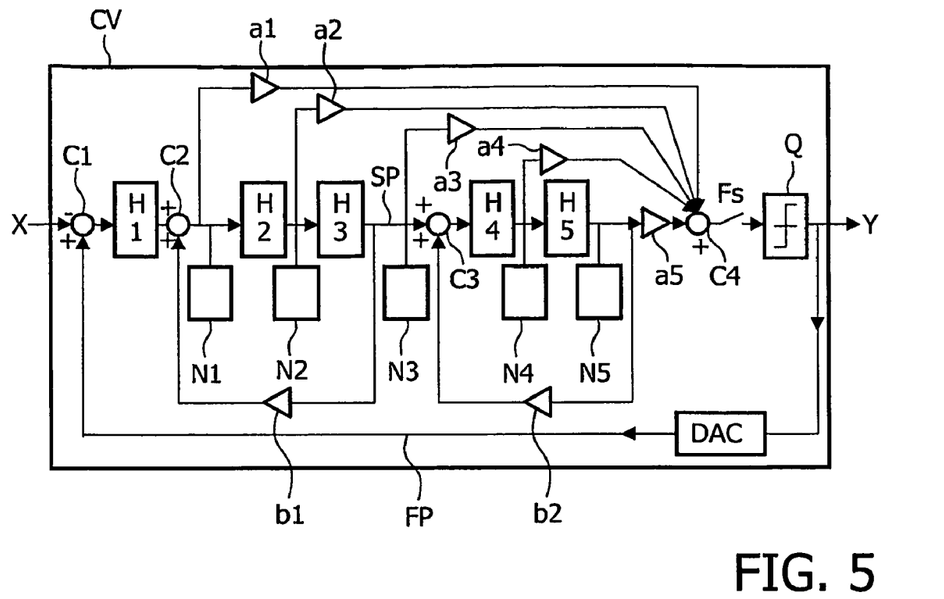

In the illustrated example of FIG. 2 the ΣΔ converter CV comprises five integrators H1-H5 connected in series in the signal path SP to define a 5-th order filter. But the number of integrators (and then the order of filters) is not limited to this example. It may be equal to any value greater than zero (0), and for instance 2 (as illustrated in FIG. 5).

Moreover, in the example illustrated in FIG. 2 the ΣΔ converter CV only comprises one non-invasive filter N1 associated to the integrator H1. But, it may comprise as many non-invasive filters as integrators. Thus in the examples of embodiment illustrated in FIGS. 3 to 5 each integrator H1-H5 is associated to one non-invasive filter N1-N5. In this case the different non-invasive filters N1-N5 are arranged to suppress different interferers belonging to different frequency bands.

It is important to note that several notches can be introduced in the STF by connecting several non-invasive filters Ni in parallel, which have different resonant frequencies, after the first integrator H1, or else after one or more integrators Hi. This allows to increase the number of interferers that can be suppressed.

It is also important to note that each integrator $H_j$ ($j>0$) is not necessarily associated to one non-invasive filter $N_i$ ($i>0$). For instance, the ΣΔ converter CV may comprise three integrators and one or two non-invasive filter(s). Moreover, in case the number of non-invasive filters is lower than the number of integrators, the non-invasive filter(s) may be associated to anyone of the integrators but not necessarily to those who are the nearest to the first combiner C1.

Each non-invasive filter Ni is a complex impedance connected in parallel to the signal path SP for operating as an open circuit in the signal band while shunting the unwanted interferers to ground. Each non-invasive filter Ni located inside the ADC loop it is therefore not critical in terms of noise, distortion and offset.

When an integrator Hj is not an active RC filter, it is preferable to connect its associated non-invasive filter Ni to the signal path SP just before it, as illustrated in FIG. 2. Therefore, the signal-to-noise ratio (SNR) is not degraded. Moreover, when one uses one non-invasive filter Ni before each integrator Hj (here i=j) to optimize the out-of-band filtering and provide more selectivity, the noises and distortions introduced by these non-invasive filters Ni are respectively suppressed by:

$$|H1(s)|, |H1(s)| \times |H2(s)|, |H1(s)| \times |H2(s)| \times |H3(s)|,$$
$$|H1(s)| \times |H2(s)| \times |H3(s)| \times |H4(s)|,$$

where $Hj(s)$ is the s-domain transfer function of an integrator Hj.

Now, when an integrator $H_j$ ($j>0$) is an active RC filter, such as an OTA-RC (Operational Transconductance Amplifier-RC) that achieves an excellent linearity performance, it is possible to connect its associated non-invasive filter Ni to the signal path SP just after it, as illustrated in FIGS. 3 to 6, or between its resistance R and capacitor C.

For instance, and as illustrated in FIG. 2, each non-invasive filter Ni is a non-invasive resonator. For instance this resonator Ni may comprise a first transconductance $-gmF$, a second transconductance $-gm1$ and a first capacitor CL connected in series, a second capacitor CF connected in parallel with the first transconductance −gmF, and a third transconductance gm2 connected in parallel with the second transconductance −gm1.

Generally speaking, the non-invasive filter Ni is an LC circuit. In cases where it is a resonator, such as the one described above, L is a gyrator comprising the transconductances gm1, gm2 and the capacitor CL.

The feedback path FP may be provided with at least one analog weighting means d1 arranged to apply a chosen weighting coefficient to the analog feedback signals outputted by the DAC to convert them into weighted analog feedback signals intended for the combiner C1.

As illustrated in FIGS. 2 to 5 the feedback path FP may be provided with as many analog weighting means dj (applying different weighting coefficients) as integrators Hj (here j=1 to 5). The analog weighting means may be transconductances or voltage attenuators, for instance. They are used to stabilize the ADC loop. In this case the signal path SP must comprise one combiner Cj before each integrator Hj in order to feed the latter with combined received analog signals X and weighted analog feedback signals.

For instance each combiner Cj is arranged to subtract the weighted analog feedback signals from X which it receives from the associated analog weighting means dj, from the analog signals it receives either from the mixer MX or from the preceding integrator Hj−1.

To offer a high frequency filtering, the ΣΔ converter CV may have a feedback and/or feedforward topology.

Figure 3:
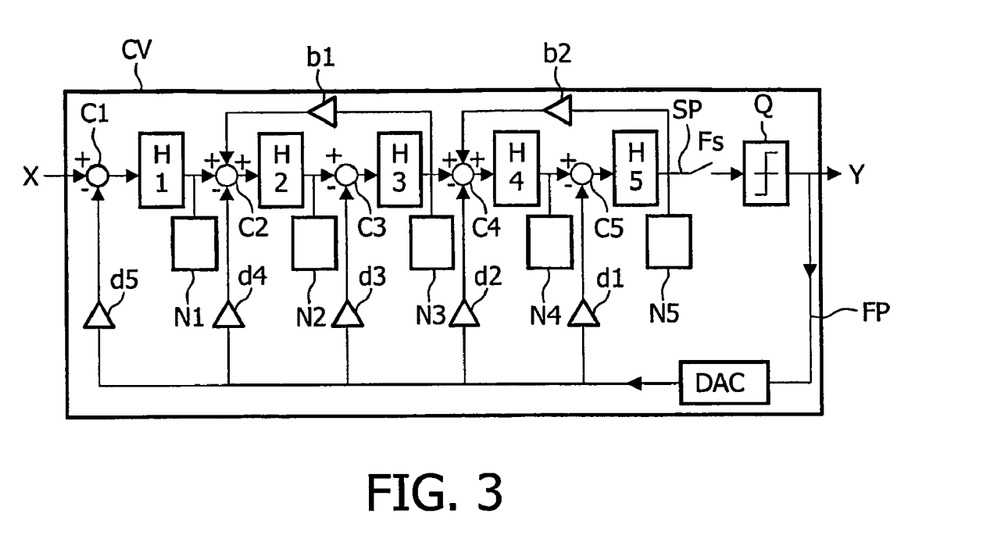

A "double" feedback topology is both illustrated in FIGS. 2 (broken line) and 3 (unbroken line). More precisely in these two examples of embodiment the ΣΔ converter CV comprises two local resonator feedback means b1 and b2 connected in parallel with the signal path SP. These local resonator feedback means may be transconductances or voltage attenuators, for instance. They are used to create notch(es) in the noise transfer function (NTF) to optimize the signal-to-quantization noise ratio in the bandwidth.

Each local resonator feedback means b1 or b2 is arranged to weight the integrated analog signals outputted by a chosen integrator H3 or H5 with a chosen coefficient to feed with weighted analog signals the combiner C2 or C4 which is located in the signal path SP before the integrator H2 or H4 located before this chosen integrator H3 or H5.

In this case each combiner (here C2 and C4) comprises an additional additive input to combine the integrated analog signals outputted by the preceding integrator (H1 or H3) with the weighted analog signals outputted by the local resonator feedback means b1 or b2 and possibly with the weighted analog feedback signals outputted by the analog weighting means d2 or d4.

It is important to note that the ΣΔ converter CV may comprise only one local resonator feedback means (for instance b1 or b2). It may also comprise more than two local resonator feedback means when the number of integrators Ni (or the filter order) is greater than or equal to 7.

Figure 4:
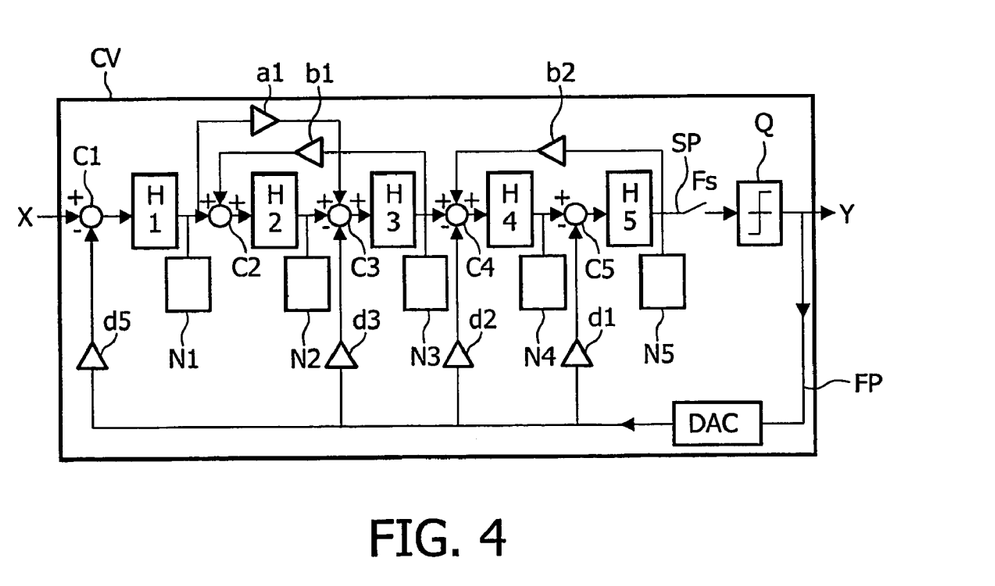

In the third example of embodiment illustrated in FIG. 4, which is a variant of the second example of embodiment illustrated in FIG. 3, the ΣΔ converter CV comprises not only two local resonator feedback means b1 and b2 connected in parallel with the signal path SP, but also one weighted feedforward summation path a1 connected in parallel with the signal path SP.

In this example the weighted feedforward summation path a1 is connected in parallel with the signal path SP between the output of the first integrator H1 (before the second combiner C2) and the third combiner C3.

This weighted feedforward summation path a1 is arranged to weight, with a chosen coefficient, the integrated analog signals outputted by the preceding integrator (here H1) to feed the combiner (here C3) with weighted analog signals, which combiner is located after the next integrator (here H2). They are also used to stabilize the ADC loop. Therefore, they may be mixed with the analog weighting means dj to maximize the advantages and minimize the drawbacks of both topologies.

In this case the combiner (here C3) comprises an additional additive input to combine the integrated analog signals outputted by the preceding integrator (here H2) with the weighted analog signals outputted by the weighted feedforward summation path (here a1) and possibly with the weighted analog feedback signals outputted by the analog weighting means d3.

It is important to note that the ΣΔ converter CV may comprise more than one weighted feedforward summation path. Moreover, it is not mandatory for the weighted feedforward summation path to be connected in parallel with the second integrator H2. It may be connected in parallel with any integrator Hj located after the first one H1. But the accumulated number of weighted feedforward summation paths aj and analog weighting means dj is equal to the filter order (L).

In the fourth example of embodiment illustrated in FIG. 5, which is a variant of the third example of embodiment illustrated in FIG. 4, the ΣΔ converter CV comprises not only two local resonator feedback means b1 and b2 connected in parallel with the signal path SP, but also four weighted feedforward summation paths a1-a4 connected in parallel with the signal path SP. A weighted feedforward summation means a5 is also provided in the signal path SP between the output of the fifth integrator H5 and the fourth combiner C4. In this fourth example the ΣΔ converter CV does not comprise any analog weighting means dj, but this might be possible provided that the accumulated number of weighted feedforward summation paths aj and analog weighting means dj is equal to the filter order (L).

In this fourth example the four weighted feedforward summation paths a1-a4 are connected in parallel with the signal path SP between the output of the first H1, second H2, third H3 and fourth H4 integrators respectively and the fourth combiner C4.

Each weighted feedforward summation path aj is arranged to weight, with a chosen coefficient, the integrated analog signals outputted by the preceding integrator (here Hj) to feed the fourth combiner C4 with weighted analog signals. In the same way the weighted feedforward summation means a5 is arranged to weight, with a chosen coefficient, the integrated analog signals outputted by the preceding integrator H5 to feed the fourth combiner C4 with weighted analog signals. For this purpose the fourth combiner C4 comprises as many additive inputs as weighted feedforward summation paths and means aj (here five) to feed the quantizer Q with the sum of all the weighted integrated analog signals outputted by the integrators H1-H5.

The ΣΔ converter CV may also have a MASH structure, for instance a MASH-2-1, or a MASH-1-2, or MASH-1-1 or else a MASH-1-1-1.

Figure 6:
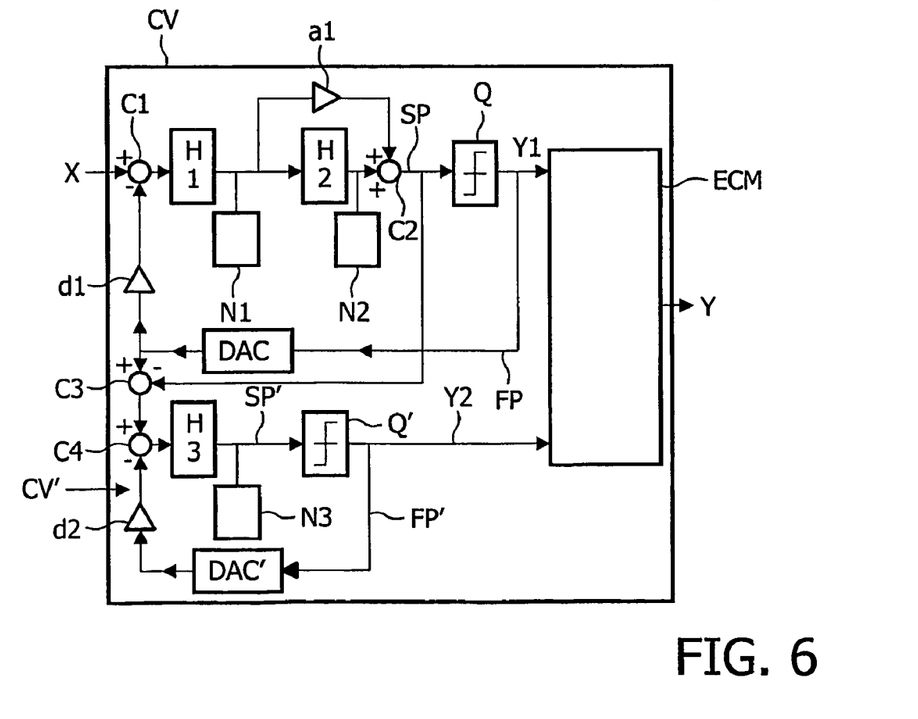

An example of MASH-2-1 structure is illustrated in the fifth example of embodiment of FIG. 6.

In this example the signal path SP comprises first H1 and second H2 integrators connected in series, and first C1 and second C2 combiners connected in series before the first integrator H1 and after the second integrator H2 respectively, but before the quantizer Q at the output of which Y is provided.

Here each integrator H1, H2 is associated with a non-invasive filter N1, N2 (connected in parallel after it, but it could be connected before it).

Moreover, a weighted feedforward summation path a1 is connected in parallel with the signal path SP between the input of the second integrator H2 and the second combiner C2. This weighted feedforward summation path a1 is arranged to weight, with a chosen coefficient, the integrated analog signals outputted by the first integrator H1 to feed the second combiner C2 with weighted analog signals to add to the integrated analog signals outputted by the second integrator H2.

The feedback path FP comprises a DAC fed with the digital signals Y1 outputted by the quantizer Q and one weighted analog weighting means d1 connected to a subtracting input of the first combiner C1.

The $\Sigma\Delta$ converter CV also comprises a third combiner C3 comprising an additive input fed with the analog feedback signals outputted by the DAC and a subtracting input fed with the analog signals outputted by the second combiner C2. This third combiner C3 also comprises an output connected to an auxiliary $\Sigma\Delta$ converter CV'.

This auxiliary $\Sigma\Delta$ converter CV' comprises an auxiliary signal path SP' which comprises here a fourth combiner C4, adapted to combine the analog signals outputted by the third combiner C3 with auxiliary weighted analog feedback signals, an auxiliary integrator H3 adapted to integrate the combined analog signals outputted by the fourth combiner C4, and an auxiliary quantizer Q' adapted to convert the integrated signals outputted by the auxiliary integrator H3 into digital signals Y2.

As illustrated, an auxiliary non-invasive filter N3, such as the ones described above, may be connected in parallel to the auxiliary signal path SP' to introduce a chosen notch into the STF of the auxiliary $\Sigma\Delta$ converter CV' by suppressing unwanted analog interference signals having a chosen frequency band corresponding to this notch.

The auxiliary $\Sigma\Delta$ converter CV' also comprises an auxiliary feedback path FP' comprising an auxiliary digital-to-analog converter DAC' arranged to convert the digital signals outputted by the auxiliary quantizer Q' into auxiliary analog feedback signals intended for the fourth combiner C4. As illustrated this auxiliary feedback path FP' may also comprise an auxiliary analog weighting means d2 arranged to convert the auxiliary analog feedback signals, outputted by DAC' into auxiliary weighted analog feedback signals intended for the fourth combiner C4.

Finally, the $\Sigma\Delta$ converter CV comprises a logic error cancellation module ECM, for providing in this example the signal Y, fed with the digital signals Y1 and Y2, which are outputted by the quantizer Q and the auxiliary quantizer Q' respectively, and arranged to determine a quantization error from these outputted digital signals and retrieve it therefrom.

It is important to note that the $\Sigma\Delta$ converter CV may comprise programmable non-invasive filter(s) (defining programmable notch(es)) to be used into reconfigurable radio circuits adapted to different standards.

Preferably, the $\Sigma\Delta$ converter CV is an integrated circuit IC, and possibly a baseband integrated circuit. Such an integrated circuit may be realized in CMOS technology or in any technology currently used in chip manufacturing, and notably in AsGa or BiCMOS technology.

A $\Sigma\Delta$ converter CV according to the invention offers a great many advantages, and notably:
- its elliptic SIT allows the filtering of interferers close to the upper edge of the bandwidth of the signals to be converted and then suited for multi-standard and/or multi-mode receivers (or transceivers) and co-banding;
- the stability of the ADC loop is preserved by the non-invasive filter(s) because unity gain frequencies and feedback (and/or feedforward) coefficients remain unchanged;
- the notch frequency as well as the quality factor on the notch(es) can be changed easily to suppress other unwanted interferers. This makes this invention very reconfigurable and brings a lot of flexibility in the system design of receivers (or transceivers);
- several notches can be chosen to suppress interferers belonging to different frequency bands;
- the selectivity of a specific interferer channel only depends on the chosen non-invasive filter (and its position), so that no high-order feedback is required to filter it;
- the use of non-invasive filter(s) tends to decorrelate the STF from the NTT;
- the notch(es) may be implemented whatever the $\Sigma\Delta$ converter topology (feedback and/or feedforward), whatever the number of processed bit(s) (single-bit or multi-bit), and whatever the number of loop (single loop or MASH structure);
- the filtering being carried out inside the ADC loop, any offset is corrected by the loop gain;
- a notch can be used to remove the inherent peaking introduced by the feedforward topology and therefore to improve the group delay variation of this kind of topology;
- the noise and distortion introduced by the non-invasive filter(s) being outside the signal path, they do not deteriorate the input-referred noise and distortion of the $\Sigma\Delta$ converter;
- in some circumstances the non-invasive filtering of the $\Sigma\Delta$ converter may decrease the complexity of the decimation filter which is sometimes provided after the ADC. Therefore, the decimation filter may consume less power and be smaller.

The invention is not limited to the embodiments of a continuous-time sigma-delta analog-to-digital converter, (baseband) integrated circuit, receiver device, transceiver device and radio communication equipment described above, only as examples, but it encompasses all alternative embodiments which may be considered by one skilled in the art to be within the scope of the claims hereafter.

The invention claimed is:

1. A continuous-time sigma-delta analog-to-digital converter for converting analog signals belonging to a chosen bandwidth into digital signals according to a signal transfer function, said converter comprising:
- a signal path including at least one combiner adapted to combine analog signals to be converted with analog feedback signals,
- at least one integrator adapted to integrate said combined analog signals, a quantizer adapted to convert said integrated signals into digital signals,
- a feedback path comprising at least a digital-to-analog converter adapted to convert said digital signals outputted by said quantizer into analog feedback signals intended for said combiner, and
- at least one non-invasive filter associated with said integrator, coupled in parallel to said signal path at a chosen location and arranged to introduce a notch into said signal transfer function by suppressing unwanted analog interference signals having a chosen frequency band that corresponds to said notch, and said feedback path comprises at least one analog weighting means adapted to convert said analog feedback signals into weighted analog feedback signals intended for said combiner.

2. The converter according to claim 1, wherein said signal path comprises at least two different integrators coupled in series.

3. The converter according to claim 2, wherein said signal path comprises five different integrators coupled in series.

4. The converter according to claim 3, wherein said signal path comprises at least two combiners located in the signal path before two chosen different integrators respectively, and in that it comprises at least two local resonator feedback means coupled connected in parallel with said signal path and arranged to weight the analog signals outputted by two other chosen integrators with chosen coefficients to feed said combiners with weighted analog signals.

5. The converter according to claim 2, further comprising at least one local resonator feedback means coupled in parallel with said signal path and arranged to weight the analog signals outputted by one chosen integrator with a chosen coefficient to feed a combiner located in the signal path before another integrator located before said chosen integrator with weighted analog signals.

6. The converter according to claim 2, further comprising at least one weighted feedforward summation path coupled in parallel with said signal path and arranged to weight the analog signals outputted by at least one chosen integrator with a chosen coefficient to feed a combiner, located after said chosen integrator, with weighted analog signals.

7. The converter according to claim 6, wherein said signal path further comprises another combiner located between the last integrator and said quantizer, and in that it comprises weighted feedforward summation paths coupled in parallel with said signal path and arranged to weight the analog signals outputted by each of said integrators except for the last one with differently chosen coefficients to feed said other combiner with weighted analog signals.

8. The converter according to claim 1, characterized in that said signal path comprises at least two non-invasive filters associated to two different integrators respectively, coupled in parallel to said signal path at two chosen locations and arranged to suppress unwanted analog interference signals having two different chosen frequency bands.

9. The converter according to claim 1, wherein each non-invasive filter is coupled to said signal path before the integrator it is associated to.

10. The converter according to claim 1, wherein each non-invasive filter is coupled to said signal path after the integrator it is associated to.

11. The converter according to claim 1, wherein each non-invasive filter comprises a resonator.

12. The converter according to claim 11, wherein said resonator comprises first and second transconductances and a first capacitor coupled in series, a second capacitor coupled in parallel with said first transconductance, and a third transconductance coupled in parallel with said second transconductance.

13. The converter according to claim 1, wherein said non-invasive filters are programmable.

14. The converter according to claim 1, wherein said digital-to-analog converter and said quantizer are of the single-bit or multi-bit type.

15. An integrated circuit, comprising a converter according to claim 1.

16. The integrated circuit according to claim 15, comprising a baseband integrated circuit.

17. A receiving device, comprising an integrated circuit according to claim 15.

18. A transceiver device, comprising a converter according to claim 1.

19. Mobile radio communication equipment, comprising a converter according to claim 1.

20. A continuous-time sigma-delta analog-to-digital converter for converting analog signals belonging to a chosen bandwidth into digital signals according to a signal transfer function, said converter comprising:
   a signal path including at least one combiner adapted to combine analog signals to be converted with analog feedback signals,
   at least one integrator adapted to integrate said combined analog signals, a quantizer adapted to convert said integrated signals into digital signals, and
   a feedback path comprising at least a digital-to-analog converter adapted to convert said digital signals outputted by said quantizer into analog feedback signals intended for said combiner,
   at least one non-invasive filter associated with said integrator, connected in parallel to said signal path at a chosen location and arranged to introduce a notch into said signal transfer function by suppressing unwanted analog interference signals having a chosen frequency band that corresponds to said notch,
   said signal path comprising at least two different integrators connected in series, and
   at least one local resonator feedback means connected in parallel with said signal path and arranged to weight the analog signals outputted by one chosen integrator with a chosen coefficient to feed a combiner located in the signal path before another integrator located before said chosen integrator with weighted analog signals.

21. A continuous-time sigma-delta analog-to-digital converter for converting analog signals belonging to a chosen bandwidth into digital signals according to a signal transfer function, said converter comprising:
   a signal path including at least one combiner adapted to combine analog signals to be converted with analog feedback signals,
   at least one integrator adapted to integrate said combined analog signals, a quantizer adapted to convert said integrated signals into digital signals, and
   a feedback path comprising at least a digital-to-analog converter adapted to convert said digital signals outputted by said quantizer into analog feedback signals intended for said combiner,
   at least one non-invasive filter associated with said integrator, connected in parallel to said signal path at a chosen location and arranged to introduce a notch into said signal transfer function by suppressing unwanted analog interference signals having a chosen frequency band that corresponds to said notch, and
   said signal path comprises five different integrators connected in series and at least two combiners located in the signal path before two chosen different integrators respectively, and in that it comprises at least two local resonator feedback means connected in parallel with said signal path and arranged to weight the analog signals outputted by two other chosen integrators with chosen coefficients to feed said combiners with weighted analog signals.

* * * * *

UNITED STATES PATENT AND TRADEMARK OFFICE
CERTIFICATE OF CORRECTION

PATENT NO. : 8,159,380 B2  
APPLICATION NO. : 11/719539  
DATED : April 17, 2012  
INVENTOR(S) : Yann P. Le Guillou and Hussein Fakhoury

It is certified that error appears in the above-identified patent and that said Letters Patent is hereby corrected as shown below:

Column 11, line 39, delete "to" insert --with--

Column 11, line 45, delete "to" insert --with--

Column 11, line 48, delete "to" insert --with--

Signed and Sealed this  
Tenth Day of July, 2012

David J. Kappos  
*Director of the United States Patent and Trademark Office*